US006436813B1

(12) United States Patent
Oikawa et al.

(10) Patent No.: US 6,436,813 B1
(45) Date of Patent: Aug. 20, 2002

(54) SEMICONDUCTOR DEVICE AND METHOD OF MANUFACTURING THE SAME

(75) Inventors: Yasushi Oikawa, Tokyo; Junichi Wada; Tomio Katata, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/532,046

(22) Filed: Mar. 21, 2000

(30) Foreign Application Priority Data

Mar. 23, 1999 (JP) .......................... 11-078145

(51) Int. Cl.$^7$ ........................ H01L 21/4763
(52) U.S. Cl. ....................... 438/637; 438/688
(58) Field of Search ..................... 438/635, 637, 438/660, 663, 664, 672, 675, 687, 688, 715

(56) References Cited

U.S. PATENT DOCUMENTS

| 4,307,132 | A | | 12/1981 | Chu et al. | |
| 5,227,329 | A | * | 7/1993 | Kobayashi et al. | 438/301 |
| 5,578,523 | A | * | 11/1996 | Fiordalice et al. | 438/672 |
| 5,789,317 | A | | 8/1998 | Batra et al. | |
| 6,071,810 | A | * | 6/2000 | Wada et al. | 438/635 |

FOREIGN PATENT DOCUMENTS

| EP | 0788145 | 8/1997 |
| JP | 11008304 | 12/1999 |
| KR | 1999-0058667 | 7/1999 |

OTHER PUBLICATIONS

J. Wada et al., Extended Abstracts (The 46$^{th}$ Spring Meeting); The Japan Society of Applied Physics and Related Societies, No. 2, p. 892, Mar. 30, 1999.
J. Wada et al., Extended Abstracts of 5$^{th}$ Workshop of LSI Interconnect; Thin Film and Surface Physics Division, The Japan Society of Applied Physics, p. 61, Jul., 1999.
Wada, J. et al., "Low Resistance Dual Damascene Process by New Al Reflow using Nb Liner", IEEE: 1998 Symposium on VLSI Technology Digest of Technical Papers, pp. 48–49, (1998).

* cited by examiner

Primary Examiner—Viet Q. Nguyen
Assistant Examiner—David Nhu
(74) Attorney, Agent, or Firm—Finnegan, Henderson, Farabow, Garrett & Dunner, L.L.P.

(57) ABSTRACT

Disclosed is a semiconductor device including a semiconductor substrate, an interlayer insulating film formed on one main surface of the semiconductor substrate and having a concave portion, a liner film formed on the inner surface of the concave portion, a wiring layer formed inside the concave portion with the liner film interposed therebetween, and an agglomeration suppressing material contained in the wiring layer for suppressing agglomeration of the material constituting the wiring layer. The agglomeration suppressing material is selected from the group consisting of O, N, Nb, Ta, Ti, W and C.

11 Claims, 8 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 11-078145, filed Mar. 23, 1999, the entire contents of which are incorporated herein by reference.

BACKGROUND OF THE INVENTION

The present invention relates to a semiconductor device having a wiring structure prepared by filling a concave portion such as a connection hole, a wiring groove, or a combination of a connection hole and a wiring groove connected to the connection hole with a conductive film, and a method of manufacturing the same.

An Al wiring is widely used in a semiconductor device. Recently, an Al wiring made of an Al-based alloy is widely used in a semiconductor device. As a multi-layer wiring, used is an Al wiring of a laminate structure (hereinafter referred to as "Al-RIE wiring) consisting of a barrier metal lower layer consisting of, for example, a TiN film and serving to suppress the reaction with the wiring and an upper layer consisting of an Al film and acting as a reflection preventing film for suppressing the irregular reflection of light in the lithography process and prepared by applying RIE to the laminate structure.

However, the Al-RIE wiring is defective in that the presence of the barrier metal film and the reflection preventing film causes a substantial cross sectional area of the Al-RIE wiring contributing to the electrical connection to be diminished so as to increase the wiring resistance. Also, the RIE reaction product is deposited on the wiring side wall in the RIE step so as to decrease the substantial Al cross sectional area and, thus, to increase the wiring resistance.

It was customary in the past to use a W-CVD technology for forming a W film by CVD excellent in the step coverage properties as a technology for forming a plug electrode connected to the Al-RIE wiring. However, the W plug electrode is defective in that the electrode exhibits a high resistance and is poor in resistance to EM (electromigration).

EM is the phenomenon that, during flow of current through the Al wiring, electrons collide against the Al atom so as to move the Al atom. W is unlikely to bring about EM, compared with Al. Therefore, if a W plug is used for connecting the upper and lower Al wirings, the W plug electrode provides a diffusion barrier of Al atoms, with the result that Al atoms are accumulated on the upstream side of the Al atom stream and Al depletion takes place on the downstream side. The accumulation and depletion of Al cause hillock and void, respectively. The progress of hillock causes short-circuiting of the Al wirings. Also, the progress of void causes breakage of the Al wiring.

On the other hand, an Al reflow technology is known to the art as a technology for forming within a connection hole an Al plug electrode having a resistance lower than that of the W plug electrode. In the Al reflow technology, which utilizes the fluidizing properties of the Al film, an Al film is filled in the connection hole by heating a semiconductor substrate.

Further, a 2-step Al reflow technology, in which an Al film is formed by a sputtering method under no heating, followed by forming another Al film by a sputtering method while heating a semiconductor substrate, is known to the art as an Al reflow technology that permits lowering the fluidizing temperature of Al and is expected to fill a connection hole having a high aspect ratio.

Application of the Al reflow technology to formation of a dual damascene structure (DD structure) is now under study. For forming a DD structure by utilizing the Al reflow technology, a connection hole and a wiring groove, which are hereinafter collectively referred to as "concave portion", are formed in an interlayer insulating film, followed by forming an Al film by a sputtering method to fill the concave portion and subsequently removing the excess Al film positioned outside the concave portion by CMP (Chemical Mechanical Polishing). The particular technology is advantageous in that the number of process steps can be decreased and the manufacturing cost can be reduced.

The Al reflow technology in which an Al film is formed by a sputtering method is originally low in the step coverage properties of the Al film. As a result, the Al film is formed thin in the bottom portion of the connection hole, and the Al agglomeration takes place in the heating step of the semiconductor substrate so as to generate voids within the connection hole.

For overcoming the above-noted problem, it is proposed to form a liner film made of a material capable of suppressing the Al agglomeration on the inner surface of the concave portion prior to the Al film formation. A Ti film having a high reactivity with the Al film is widely used as a liner film.

However, if the aspect ratio of the connection hole is high, the Ti liner film fails to cover sufficiently the side wall in the bottom portion of the connection hole, giving rise to agglomeration of Al in the bottom portion of the connection hole. If Al agglomeration takes place, the diffusion route of Al is made discontinuous, giving rise to the problem that it is impossible to fill the connection hole with the Al film.

It should also be noted that an $Al_3Ti$ film, which is formed as a result of reaction with Al, is formed within the concave portion. Particularly, the $Al_3Ti$ film formed at the bottom portion of the connection hole acts as a diffusion barrier of Al like the W plug, leading to deterioration in the resistance to EM.

Further, if an $Al_3Ti$ film is formed on the inner surface of the wiring groove, the volume of the Al film within the wiring groove is decreased, leading to an increased wiring resistance.

As described above, application of the Al reflow technology to formation of a DD structure is now under study, and it is proposed to use a Ti liner film having a high reactivity with the Al film as a underlying film.

However, if the aspect ratio of the connection hole is high, the Ti liner film fails to cover sufficiently the side wall in the bottom portion of the connection hole, giving rise to Al agglomeration in the bottom portion of the connection hole. As a result, the Al film fails to fill the connection hole. Also, an $Al_3Ti$ film formed within the concave portion causes deterioration in the resistance to EM so as to increase the wiring resistance.

BRIEF SUMMARY OF THE INVENTION

An object of the present invention is to provide a semiconductor device comprising a wiring structure that permits filling a concave portion with a wiring layer even if the concave portion has a high aspect ratio.

Another object is to provide a method of manufacturing a semiconductor device comprising a wiring structure that permits filling a concave portion with a wiring layer even if the concave portion has a high aspect ratio.

According to a first aspect of the present invention, there is provided a semiconductor device, comprising a semiconductor substrate, an interlayer insulating film formed on one main surface of the semiconductor substrate and having a concave portion, a liner film formed on the inner surface of the concave portion, a wiring layer formed inside the concave portion with the liner film interposed therebetween, and an agglomeration suppressing material contained in the wiring layer for suppressing agglomeration of the material constituting the wiring layer.

According to a second aspect of the present invention, there is provided a semiconductor device, comprising a semiconductor substrate, an interlayer insulating film formed on one main surface of the semiconductor substrate and having a concave portion, a liner film formed on the inner surface of the concave portion, a wiring layer formed inside the concave portion with the liner film interposed therebetween, an agglomeration suppressing material contained in the wiring layer for suppressing agglomeration of the material constituting the wiring layer, and a layer of reaction product between the material constituting the liner film and the material constituting the wiring layer, the reaction product layer being formed at any one of the interface between the liner film and the wiring layer and the interface between the interlayer insulating film and the wiring layer.

According to a third aspect of the present invention, there is provided a method of manufacturing a semiconductor device, comprising the steps of forming an interlayer insulating film having a concave portion on a semiconductor substrate, forming a liner film on the inner surface of the concave portion, forming a first conductive film within the concave portion, the first conductive film containing an agglomeration suppressing material for suppressing agglomeration of the first conductive film, and forming a second conductive film within the concave portion while heating the semiconductor substrate and permitting reflow of the first and second conductive films to fill the concave portion with these conductive films.

Further, according to a fourth aspect of the present invention, there is provided a method of manufacturing a semiconductor device, comprising the steps of forming an interlayer insulating film having a concave portion on a semiconductor substrate, forming a liner film on the inner surface of the concave portion, forming a first conductive film that does not contain impurities within the concave portion, and forming a second conductive film containing impurities within the concave portion while heating the semiconductor substrate and permitting reflow of the first and second conductive films to fill the concave portion with the conductive films.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
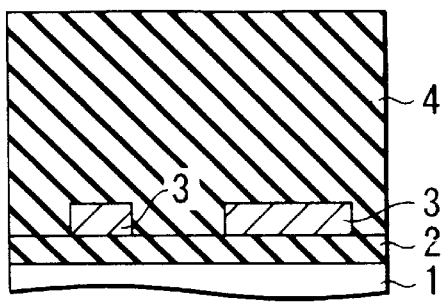
FIGS. 1A to 1F are cross sectional views collectively showing a method of manufacturing a semiconductor device according to a first embodiment of the present invention.

The present invention is featured in that an agglomeration suppressing material for suppressing agglomeration of the material constituting a wiring layer is contained in the wiring layer formed inside a concave portion of an interlayer insulating film formed on one main surface of a semiconductor substrate with a liner film interposed between the inner wall of the concave portion and the wiring layer.

At least one element selected from the group consisting of O, N, Nb, Ta, Ti, W and C can be used as the agglomeration suppressing material.

On the other hand, a single layer film or a laminate film of a material selected from the group consisting of Ni, Ti, NbN and TiN can be used as a liner film.

The wiring layer can be formed of a metal selected from the group consisting of Al, Cu, an Al alloy and a Cu alloy.

The term "concave portion" used herein includes a wiring groove, a connection hole and a combination of a connection hole and a wiring groove connected to the connection hole.

It is possible for a layer of the reaction product between the material constituting the liner film and the material constituting the wiring layer to be formed at the boundary between the liner film and the wiring layer or at the boundary between the interlayer insulating film and the wiring layer. It is desirable for the reaction product layer to be formed discontinuous.

The present invention also provides a method of manufacturing the semiconductor device outlined above.

The method of the present invention is featured in that, after formation of a first conductive film containing an agglomeration suppressing material in a concave portion, a second conductive film is formed in the concave portion while heating the semiconductor substrate and reflow of the first and second conductive films is achieved to fill the concave portion with the conductive films.

In the method of the present invention, it is possible to allow the agglomeration suppressing material to be adsorbed on the surface of the first conductive film after formation of the first conductive film. Alternatively, the agglomeration suppressing material can be introduced into the first conductive film during formation of the first conductive film. Further, it is possible to form a conductive film containing an agglomeration suppressing material.

As described above, the present invention makes it possible to fill a concave portion with a wiring layer even if the concave portion has a high aspect ratio.

To be more specific, according to the method of the present invention for manufacturing a semiconductor device, reflow of the first and second conductive films is achieved under the condition that an agglomeration suppressing material is contained in the first conductive film, making it possible to suppress effectively the agglomeration of the first and second conductive films. As a result, it is possible to fill the inner space of a concave portion with the wiring layer consisting of the first and second conductive films, even if the concave portion has a diameter of the opening not larger than 0.18 $\mu$m and an aspect ratio not lower than 5.0.

Various embodiments of the present invention will now be described with reference to the accompanying drawings.
(First Embodiment)

FIGS. 1A to 1F are cross sectional views collectively showing a method of manufacturing a semiconductor device according to a first embodiment of the present invention.

In the first step, a first interlayer insulating film 2 and a first wiring layer 3 are formed on a silicon substrate having an element (not shown) formed thereon, as shown in FIG. 1A. The first wiring layer 3 is made of, for example, Al or W.

Then, a second interlayer insulating film 4 is formed on the entire surface to cover the first wiring layer 3. The second interlayer insulating film 4 consists of an insulating film such as an insulating film formed by a plasma CVD using TEOS as a raw material gas, a F-added insulating film having a low dielectric constant, or an SOG film.

In the next step, a connection hole 5a extending to reach the first wiring layer 3 and a wiring groove 5b positioned on the connection hole 5a, said connection hole 5a and said wiring groove 5b being collectively referred to hereinafter as "a concave portion 5", are formed in the second interlayer insulating film 4 by photolithography and RIE.

Figure 1D:
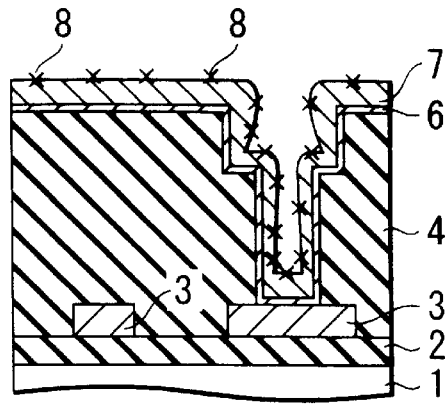
Figure 1B:
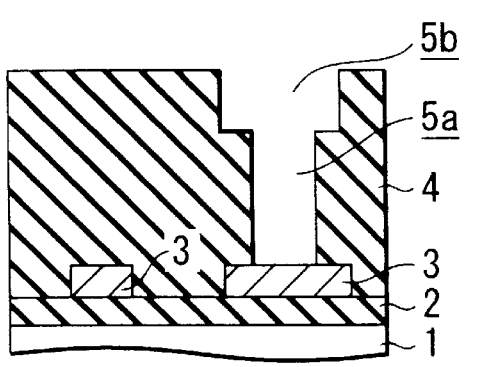
Figure 1E:
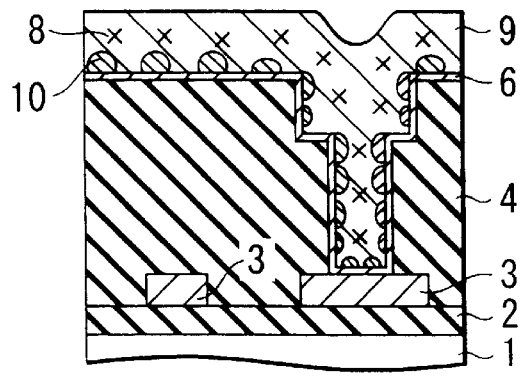
Figure 1C:
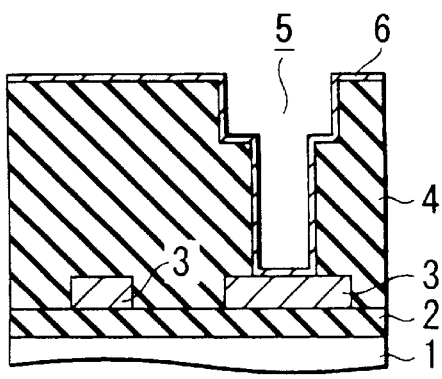

Further, a Nb liner film, a first Al film, and a second Al film are formed consecutively under vacuum, followed by causing reflow of the first Al film and the second Al film to fill the inner space of the concave portion 5 with the first and second Al films as shown in FIGS. 1C to 1E. Cluster tool used in these steps are a second Al sputtering chamber and a substrate cooling chamber connecting to a wafer transfer chamber. The substrate is transferred among these chambers through the wafer transfer chamber.

Specifically, the silicon substrate 1 is heated in advance within the substrate heating chamber in order to decrease the release of the gas from within the second interlayer insulating film 4 and to decrease the release of the gas adsorbed on the surface in the heating step for forming the second Al film, which is to be described hereinlater. To be more specific, the silicon substrate 1 is heated under temperatures falling within a range of between 300° C. and 500° C. with a PBN heater or a halogen lamp heater each equipped with an electrostatic chuck.

In the next step, a native oxide film on the surface of the first wiring layer 3 exposed to the bottom surface of the connection hole 5a and the stains attached in the step of forming the concave portion 5 are removed by an Ar sputter-etching within the Ar sputter-etching chamber. A plasma sputtering apparatus of a capacitor coupling type or an induction coupling type can be used for the Ar sputter-etching.

The native oxide film and the stains attached to the connection portion to the first wiring layer 3 in the step of forming the concave portion 5 can be removed by washing with an organic alkali material, making it unnecessary to perform the Ar sputter-etching.

Then, a Nb liner film 6 is formed in a thickness of 7.5 to 50 nm on the second interlayer insulating film 4 in a manner to cover the inner surface (bottom surface and side surface) of the concave portion 5 by a long throw sputtering (LTS), as shown in FIG. 1C. LTS is a sputtering method in which the distance between the substrate and the target is set longer than that in the ordinary sputtering method and the gas pressure in the sputtering step is set low to allow the sputtered particles to have a directivity. It follows that, in the case of employing LTS, the Nb liner film 6 can be formed on the side surface in the deep portion of the connection hole 5a having an aspect ratio not lower than 1.

The Nb liner film 6, which serves to suppress agglomeration of a first Al film 7 that is to be formed later, should desirably be formed uniform on the inner surface of the connection hole 5a. However, since the film formed by LTS is rendered asymmetric in the wafer edge portion, it is difficult to form the Nb liner film 6 on the side surface of the connection hole 5a on the side of the center of the wafer.

For improving the asymmetry in the shape of the Nb liner film 6, it is effective to control the Ar gas pressure. For example, where the Nb target has a diameter of about 300 mm and the distance between the Nb target and the substrate is 300 mm, it is effective to control the Ar pressure at 0.02 to 0.1 Pa.

In the next step, the silicon substrate is transferred into the first Al sputtering chamber for forming by LTS the first Al film 7 constituting the first Al wiring in a thickness of 250 to 600 nm. If the opening of the concave portion 5 is not closed by the first Al film 7, the first Al film can be formed thicker than 600 nm. It is desirable to form the first Al film 7, which defines a diffusion passageway for fluidizing Al into the inner region of the connection hole 5a, as a continuous film extending from the upper opening to reach the bottom portion of the connection hole 5a.

Even if the first Al film 7 is formed as a continuous film on one side surface of the connection hole 5a because of the asymmetry in the shape of the first Al film 7 in the wafer edge portion, the filling of the connection hole 5a with Al is not adversely affected. Therefore, it is effective in terms of the Al loading to form the first Al film 7 to have a high directivity.

If the diameter of the Al target is about 300 mm, the distance between the target and the substrate is 300 mm, and the Ar pressure is controlled at 0.02 to 0.1 Pa, it is possible to suppress agglomeration of the first Al film 7. In this step, the silicon substrate 1 is not heated or cooled.

Immediately after formation of the first Al film 7, oxygen is introduced into the first Al sputtering chamber to permit oxygen 8 to be adsorbed on the surface of the first Al film 7, as shown in FIG. 1D. Then, the silicon substrate 1 is transferred into the second sputtering chamber to form a second Al film 9 on the entire surface in a thickness of 50 to 400 nm by a sputtering method while heating the silicon substrate 1 to, for example, 450° C., thereby filling the inner space of the concave portion 5 with the first and second Al films, as shown in FIG. 1E. In this step, AlNb alloy films 10 resulting from the reaction between the Nb liner film 6 and the first Al film 7 are partially formed at the interface between the inner surface of the concave portion 5 and the first and second Al films 9. According to the research conducted by the present inventors, the amount of the AlNb alloy film 10 is smaller than that of a Ti$_3$Al film formed in the case of using a Ti liner film. Therefore, formation of the AlNb alloy films 10 does not constitute a problem in terms of the increase in the wiring resistance.

The second Al film is formed by a standard sputtering method in which the diameter of the Al target is 300 mm, and the distance between the Al target and the substrate is 60 mm. Alternatively, LTS can also be employed for forming the second Al film, if the film-forming rate is set substantially equal to that in the standard sputtering method.

Figure 1F:
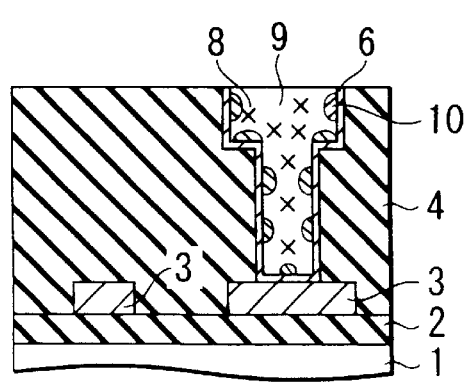

Finally, the excess first and second Al film 9 outside the concave portion 5, the AlNb alloy film 10 and the Nb liner film 9 are removed by CMP so as to finish forming the Al-based second wiring layer 9, as shown in FIG. 1F. The second wiring layer 9 is a dual damascene wiring.

It has been found through the research conducted by the present inventors that, if oxygen 8 is adsorbed on the surface of the first Al film 7 by introducing oxygen into the first Al sputtering chamber after formation of the first Al film 7 as in the embodiment described above, it is possible to improve the loading characteristics of the first Al film 7, compared with the case where oxygen is not adsorbed on the surface of the first Al film 7.

Figure 2:
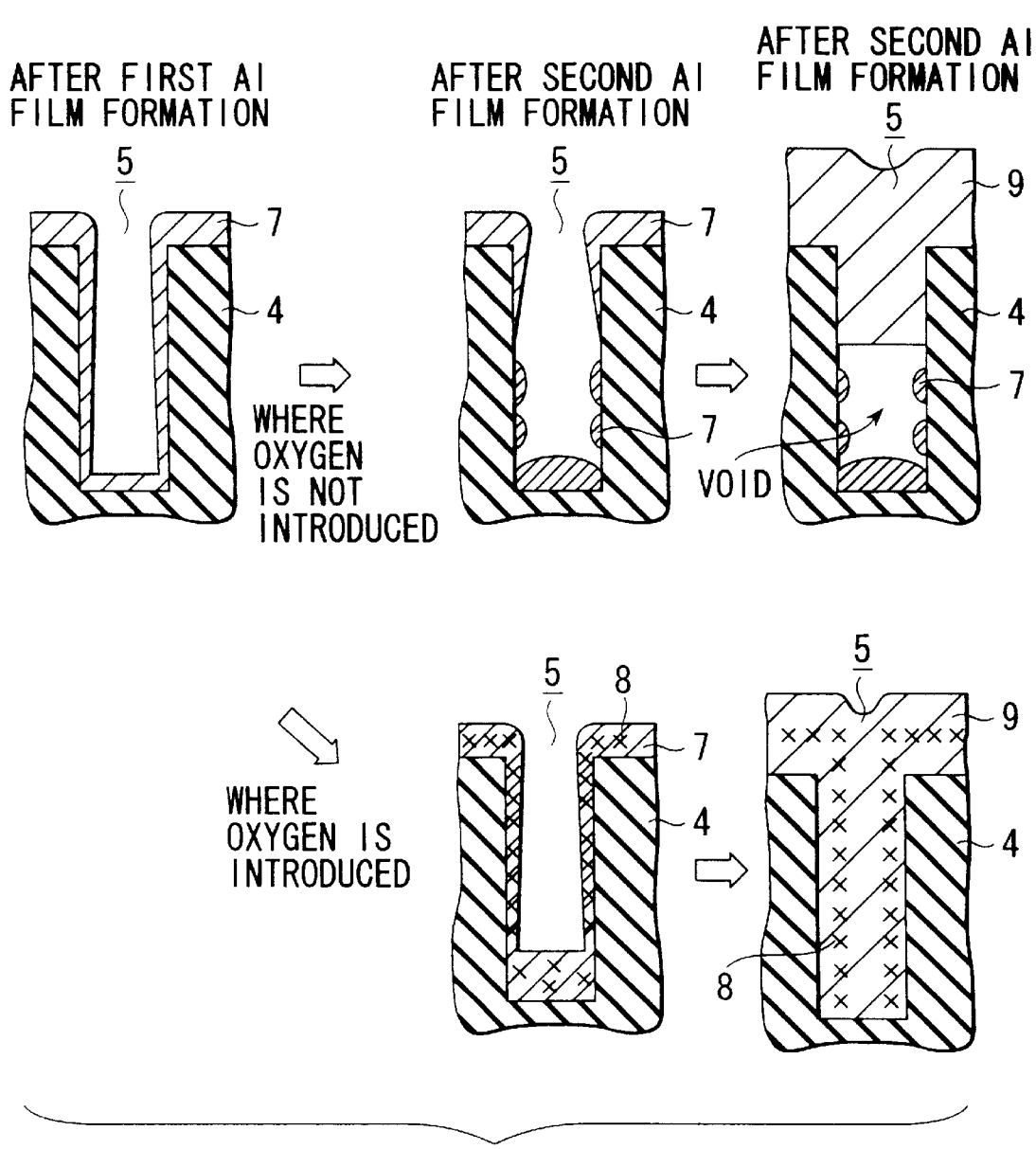
FIG. 2 shows the process starting with formation of a first Al film and ending in the filling of a connection hole with first and second Al films, covering the cases where oxygen is introduced and is not introduced, respectively.

FIG. 2 shows the process starting with formation of a first Al film and ending in the filling of a concave portion 5 with the first and second Al films 9, covering the cases where oxygen is introduced and is not introduced, respectively, after formation of the first Al film 7.

In order to fill the concave portion 5 formed in the second interlayer insulating film 4 with the first and second Al film 9, it is necessary to maintain the fluidity of Al within the concave portion 5 until completion of the filling. In the Al reflow method employed in this embodiment (first embodiment), the first Al film 7 is formed first without heating the substrate, followed by forming the second Al film continuously under vacuum while heating the silicon substrate. In order to maintain the fluidity of Al in the Al reflow method, it is necessary to form the first Al film 7 as a continuous film. It is also necessary for a part of the second Al film to be fluidized within the concave portion in the process of forming the second Al film, with the first Al film 7 utilized as a diffusion route.

If the first Al film 7 is a discontinuous film, the diffusion route of Al is closed in the process of forming the second Al film, with the result that the concave portion 5 fails to be filled completely with Al. It should be noted that the first Al film 7 tends to be agglomerated by the heating in the initial stage of forming the second Al film, with the result that the first Al film 7 is rendered discontinuous.

Figure 3:
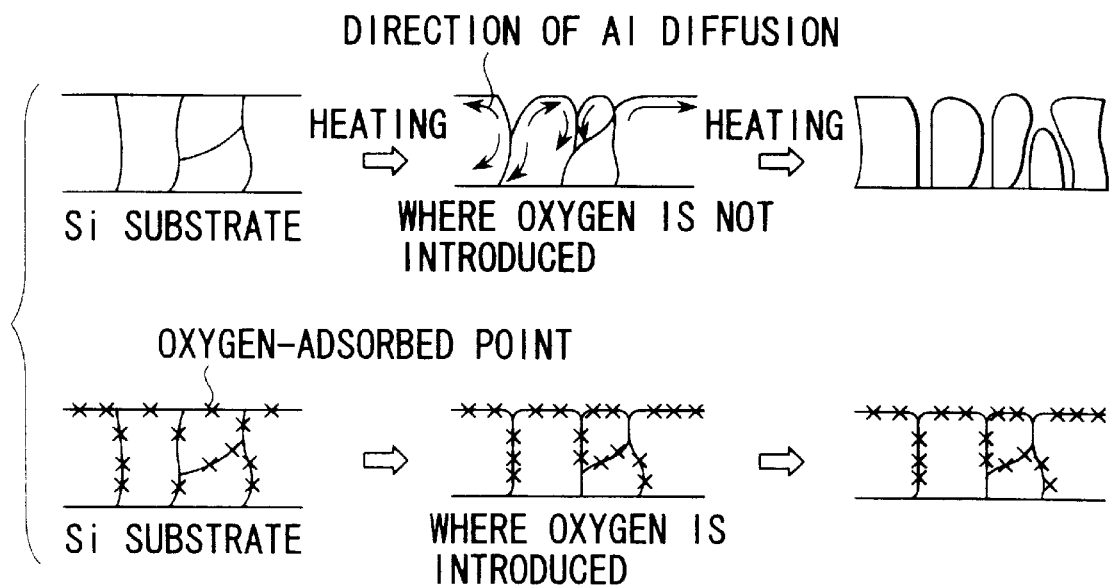
FIG. 3 shows an Al agglomeration process, covering the cases where oxygen is introduced and is not introduced, respectively.

FIG. 3 shows an Al agglomeration process, covering the cases where oxygen is introduced and is not introduced, respectively.

The Al agglomeration is caused by the surface diffusion and the grain boundary diffusion in the heating step. It should be noted that the surface of an Al film on which a native oxide film is not formed and the crystal grain boundary having a large number of dangling bonds are low in diffusion coefficient and, thus, Al atoms are vigorously migrated by the heating. By this migration, the mass of Al tends to have a shape having a low surface energy. Specifically, the mass of Al tends to become spherical. Agglomeration denotes that separation from the individual crystal grain boundary takes place so as to cause the mass of Al to be shaped like an island.

The Al agglomeration tends to take place easily if the Al film is thinner. In this embodiment, the first Al film is formed by LTS. Since LTS permits the sputtered particles to have a directivity, compared with the standard sputtering method, it is possible to form the first Al film 7 on the side surface in the bottom portion of the concave portion 5 having a high aspect ratio as shown in FIG. 2. It should be noted, however, that, with progress in the formation of the first Al film 7, the incident angle of the sputtered particles that are incident on the bottom portion of the concave hole 5 is increased so as to decrease the attaching rate of the sputtered particles. The incident angle of potentiality is smallest in the side wall on the bottom portion of the concave portion 5 and, thus, the film thickness is made smallest in the side wall portion noted above. It follows that the Al agglomeration is started at the side wall on the bottom portion of the concave portion where the first Al film is thinnest. Where the first Al film 7 is made discontinuous in this portion by the Al agglomeration, the route of the Al diffusion into the deeper portion of the concave portion 5 is closed, giving rise to the problem that a void is left in the deeper portion of the concave portion 5.

Where oxygen is introduced into the first Al sputtering chamber after formation of the first Al film 7, oxygen 8 is adsorbed on the surface of the first Al film 7, as shown in FIG. 1D. The adsorbed oxygen serves to suppress the surface diffusion of Al on the surface of the first Al film 7 so as to make it possible to suppress the Al agglomeration by the heating in the step of forming the second Al film.

However, where a large amount of oxygen 8 is introduced, a thick oxide film is formed on the surface of the first Al film 7. If the oxide film is formed thick, it is difficult for the shape of the first Al film 7 to be changed, causing the first Al film 7 to decrease to contribute to flowability by the body diffusion. As a result, the amount of Al flowability is decreased in the thermal budget in the step of forming the second Al film.

It should also be noted that the wettability of Al is low on the oxide film ($Al_2O_3$) that is formed thick. As a result, the second Al film tends to be agglomerated on the aluminum oxide film formed on the first Al film in the step of forming the second Al film, making it difficult to fill the concave portion 5 with the Al film. Thus, in order to fill, particularly, the concave portion 5 having a high aspect ratio with the Al film, it is necessary to suppress agglomeration of the first Al film 7 while maintaining the fluidity of the first Al film and the wettability at the interface between the first Al film and the second Al film. Therefore, it is necessary to control appropriately the amount of oxygen introduced into the first Al sputtering chamber.

Figure 4:
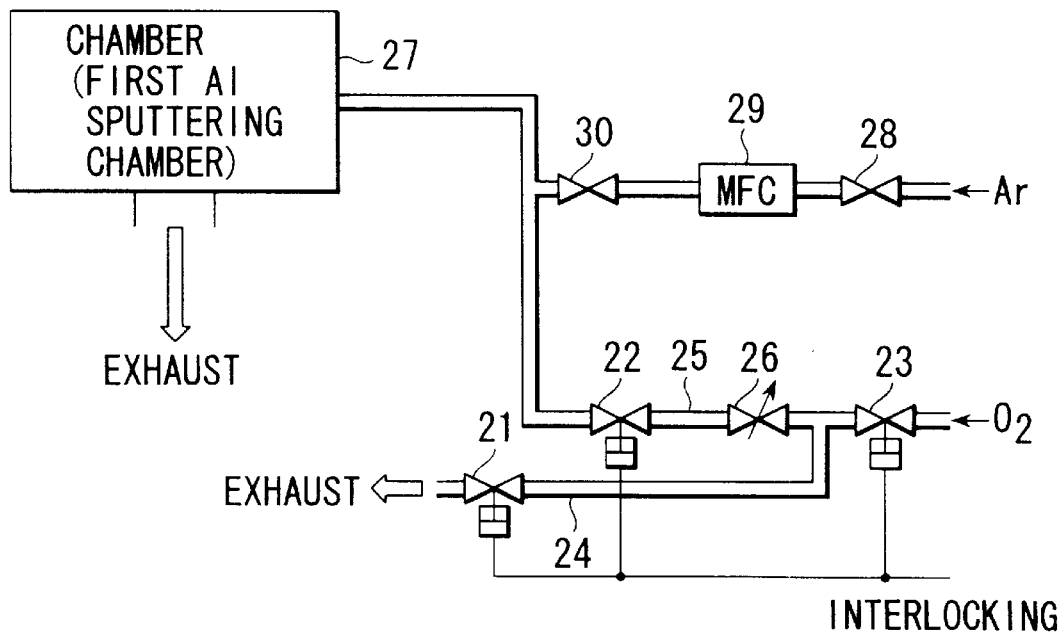
FIG. 4 schematically shows an oxygen introducing mechanism that permits easily controlling the oxygen introducing amount appropriately.

FIG. 4 schematically shows an oxygen introducing mechanism that permits easily controlling the oxygen introducing amount appropriately. The mechanism shown in the drawing is adapted for preventing introduction of a large amount of oxygen so as to prevent formation of a thick aluminum oxide film.

In the mechanism shown in FIG. 4, a valve 21 is left open and valves 22 and 23 are closed under the state that oxygen ($O_2$) is not introduced. Therefore, pipes 24 and 25 are exhausted under the state that oxygen is not introduced. When oxygen is introduced, the valve 21 is closed, and the valves 22 and 23 are opened so as to permit oxygen having the pressure controlled in advance by a pressure control valve 26 to be introduced into a first Al sputtering chamber 27.

Since the pipes 24, 25 are exhausted under the state that oxygen is not introduced, the oxygen within the pipe 24 does not flow into the pipe 25 when the valve 23 is opened, making it possible to prevent oxygen from being introduced into the chamber 27 under a pressure higher than a predetermined pressure. It follows that it is possible to prevent a large amount of oxygen from being introduced into the chamber 27 so as to prevent a thick oxide film from being formed. Incidentally, reference numeral 28 shown in FIG. 4 denotes a valve, reference numeral 29 denotes a mass flow controller, and reference numeral 30 denotes a valve.

Figure 5:
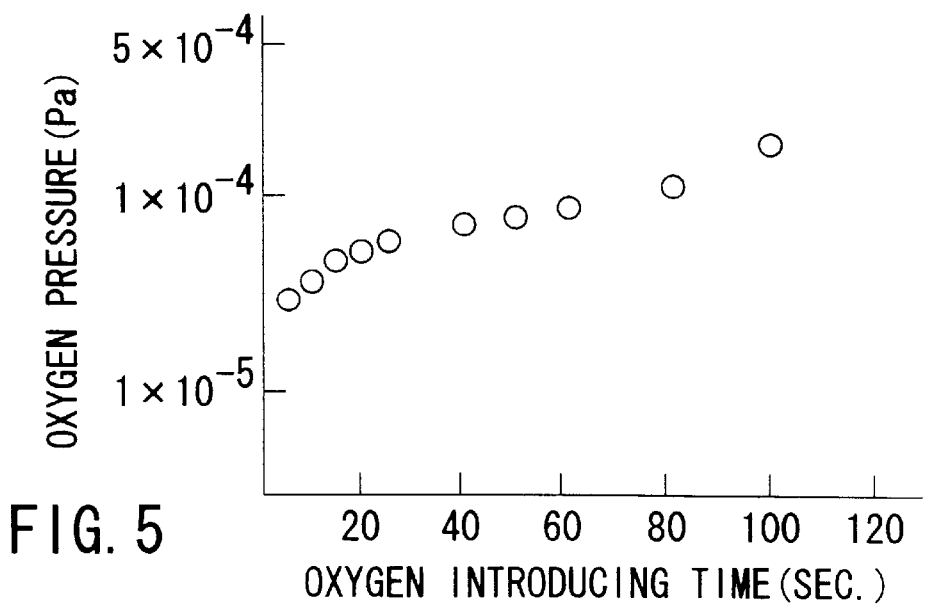
FIG. 5 is a graph showing the change with time in the oxygen pressure, covering the case where oxygen is introduced after formation of the first Al film such that the oxygen pressure under the state of equilibrium is controlled at $5.0 \times 10^{-4}$ Pa by operating the pressure control valve included in the oxygen introducing mechanism shown in FIG. 4.

FIG. 5 is a graph showing the change with time in the oxygen pressure, covering the case where oxygen is introduced after formation of the first Al film such that the oxygen pressure under the state of equilibrium is controlled at $5.0 \times 10^{-4}$ Pa by operating the pressure control valve 26 included in the oxygen introducing mechanism shown in FIG. 4. It is clearly shown in FIG. 5 that the oxygen pressure in the initial stage of the oxygen introduction is lower than the pressure under the state of equilibrium and, then, the oxygen pressure is gradually increased to reach the pressure under the state of equilibrium.

In the step of forming the first Al film 7, an active Al is attached to a shield plate within the chamber 27, and the active Al surface is also exposed on the surface of the sputter target. It follows that, where oxygen is introduced into the chamber 27 after formation of the first Al film 7, the introduced oxygen is gettered by the active Al, with the result that a predetermined time is required for the oxygen pressure to be increased to reach the pressure under the state of equilibrium.

The time required for stabilization of the oxygen pressure is dependent on the inner volume of the chamber 27, the exhaust capacity of the vacuum pump, the area of the shield plate having Al attached thereto, and the amount of the active Al on the surface of the shield plate. It follows that the oxygen pressure under the state of equilibrium does not provide an actual absolute parameter for adsorbing the oxygen on the surface of the first Al film 7.

Table 1 given below shows the filling tendency of Al in the case where the oxygen pressure is controlled at various levels within the chamber 27 showing the exhaust characteristics shown in FIG. 5 and Al is introduced for 20 seconds after formation of the first Al film 7:

TABLE 1

| Aspect ratio | $O_2$ pressure (Pa) | | | | | |
|---|---|---|---|---|---|---|
| | None | $1.0 \times 10^{-4}$ | $3.0 \times 10^{-4}$ | $5.0 \times 10^{-4}$ | $1.0 \times 10^{-3}$ | $1.0 \times 10^{-2}$ |
| 3.0 | ○ | ○ | ○ | ○ | ○ | X |
| 3.8 | X | ○ | ○ | ○ | ○ | X |
| 4.0 | X | ○ | ○ | ○ | ○ | X |
| 4.5 | X | X | ○ | ○ | ○ | X |
| 5.0 | X | X | ○ | ○ | ○ | X |
| 6.0 | X | X | X | ○ | ○ | X |
| 7.0 | X | X | X | ○ | ○ | X |

(○: complete filling
X: poor filling)

Table 1 shows that, with increase in the oxygen pressure from $1.0 \times 10^{-4}$ Pa, the aspect ratio of the hole that permits loading is increased. However, if the oxygen pressure is increased to reach $1.0 \times 10^{-2}$ Pa, it is impossible to fill completely the concave portion having an aspect ratio 3 With Al. In other words, if the oxygen pressure is gradually increased, the oxygen adsorbed on the surface of the first Al film 7 serves to suppress agglomeration of the first Al film 7 so as to improve the filling capability of Al.

However, if the oxygen pressure is further increased, an aluminum oxide film is formed on the surface of the first Al film 7 so as to cause the flowability of the first Al film 7 to be unlikely to take place. In addition, the wettability between the second Al film and the first Al film is lowered so as to inhibit the flowability of the second Al film into the concave portion 5, resulting in failure to fill completely the concave portion 5 with Al.

As described above, in order to improve the filling capability of Al in the concave portion, it is necessary to control the oxygen pressure at the level at which the Al flowability is not lowered while suppressing agglomeration of the first Al film and the wettability between the second Al film and the first Al film is not lowered. In this embodiment, it is appropriate to control the oxygen pressure under the state of equilibrium at $5.0 \times 10^{-4}$ Pa.

In the system shown in FIG. 4, the oxygen pressure is controlled by operating the pressure control valve so as to control the amount of oxygen introduced into the chamber 27 after formation of the first Al film 7. Alternatively, it is also possible to control the oxygen flow rate for controlling the oxygen pressure within the chamber 27. In the case of using a chamber having the exhaust characteristics shown in this embodiment (first embodiment), the oxygen supply amount can be controlled under the flow rate of 0.1 to 1.0 sccm in view of the oxygen pressure noted above. It is desirable to use a mass flow controller.

The method of introducing oxygen into the chamber 27 after formation of the first Al film 7 employed in this embodiment is effective for filling the concave portion 5 of a high aspect ratio, e.g., not larger than 0.18 μm in the diameter of the opening and not smaller than 0.95 μm in the depth, with Al film. It should be noted, however, that the flowability of Al is lowered by the oxygen introduction. Therefore, where the concave portion 5 having a large inner volume is filled with Al, it is possible for the concave portion 5 not to be filled with Al completely because of the poor flowability of Al.

For overcoming the inconvenience noted above, it is effective to use an Al film containing Cu as the second Al film. The presence of Cu makes the melting point of the Cu-containing Al film lower than that of the pure Al film so as to increase the flowability. It follows that, in the case of using a Cu-containing Al film as the second Al film, the concave portion 5 having a large inner volume can be filled easily and completely with Al.

It should also be noted that Cu contained in the second Al film is precipitated at the grain boundary of Al so as to suppress the grain boundary diffusion of Al when an electric current flows therethrough so as to improve the resistance to the electromigration. The concentration of Cu precipitated at the grain boundary of Al can be easily increased by increasing the Cu concentration in the second Al film.

The wiring resistance can also be lowered by using an Al film containing another impurity such as copper silicide.

The damascene wiring is defective in that, if the wiring width is gradually decreased with the depth of the wiring groove kept constant, the effective resistivity (wiring resistance) of the wiring is increased, as described below. Specifically, FIGS. 14A and 14B are cross sectional views each showing an Al damascene wiring 15 formed by the process comprising forming the Nb liner film 14 within the wiring groove, followed by Al reflow and CMP.

Figure 14A:
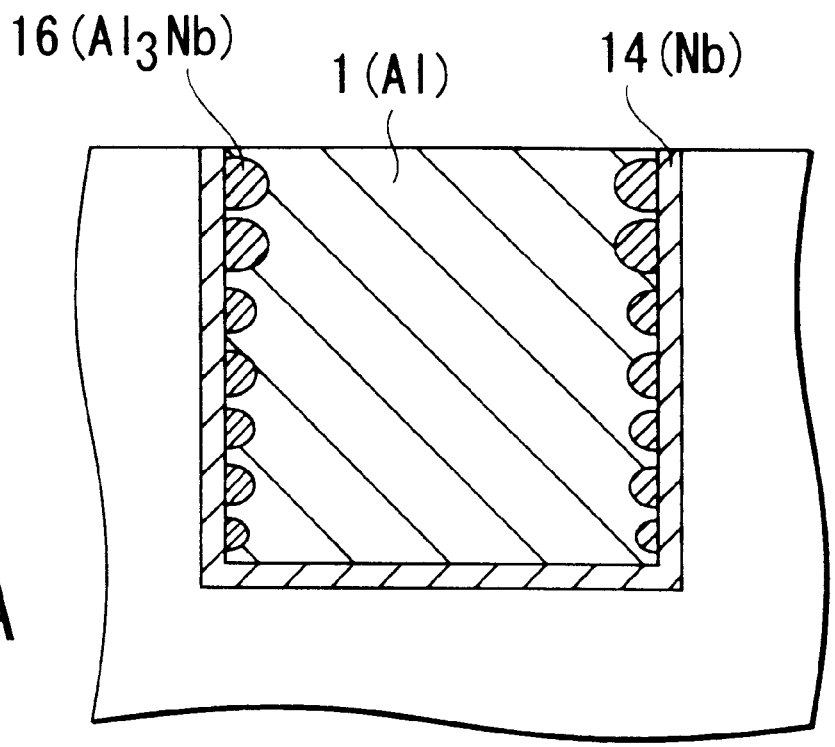
FIGS. 14A and 14B are cross sectional views showing a problem inherent in the conventional damascene wiring and showing how to solve the problem in the present invention, respectively.
Figure 14B:
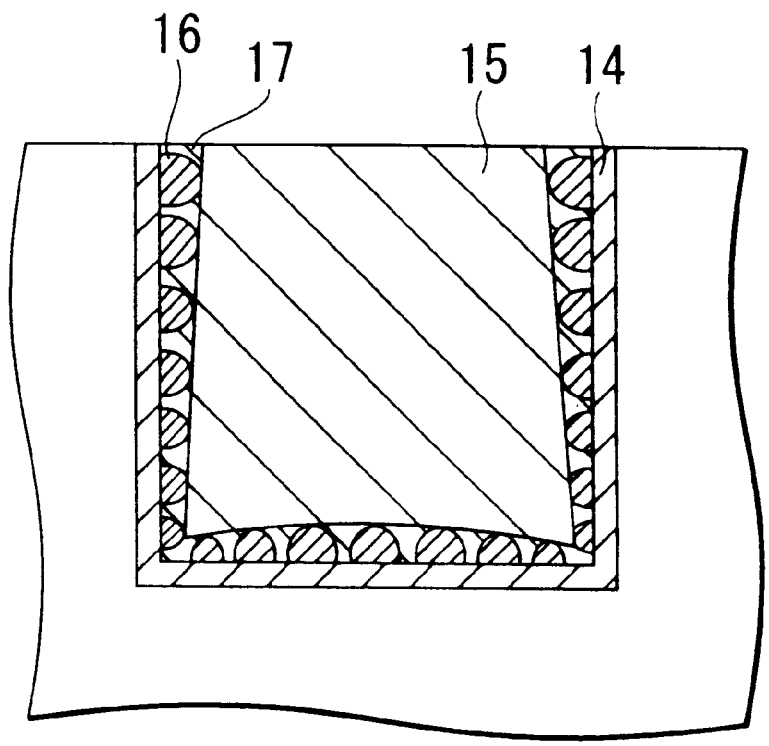

As shown in FIG. 14A, a granular $Al_3Nb16$ is formed as a result of the reaction between Al and Nb at the side surface and the bottom surface of the wiring groove. As a result, the electrons flowing along the side surface and the bottom surface of the wiring groove are scattered by the granular $Al_3Nb16$.

The $Al_3Nb16$ grains are positioned apart from each other and some $Al_3Nb16$ grains are positioned close to each other such that the distance between adjacent $Al_3Nb16$ grains is shorter than the mean free path of electrons, leading to a high scattering probability of electrons. It follows that Al particles positioned between adjacent $Al_3Nb16$ grains are strongly affected by the electron scattering, with the result that the effective resistivity is made higher than the resistivity inherent in the material so as to increase the wiring resistance.

However, it has been found through the research conducted by the present inventors that, in the case of using Al—Si(1.0 wt %)—Cu(0.5 wt %) alloy as the wiring material, a reaction takes place between Si contained in the Al alloy and Nb by the heating in the Al reflow step so as to form niobium silicide 17, thereby suppressing formation of $Al_3Nb$. As a result, it is possible to diminish the ratio of the granular $Al_3Nb16$ occupying the wiring groove so as to achieve a low wiring resistance even in the case of a thin damascene wiring. It should be noted that, even if the ratio of the granular $Al_3Nb$ occupying the wiring groove is diminished, the adhesivity can be maintained by the presence of the silicide between Si and Nb, making it possible to form a damascene wiring whose resistance to EM and resistance to SM are not deteriorated.

It should also be noted the Al—Si(1.0 wt %)—Cu(0.5 wt %) alloy has a melting point lower than that of Al—Cu(0.5 wt %) and, thus, exhibits a high flowability in the reflow step so as to provide a good wiring material having a high loading capability. In other words, the Al—Si(1.0 wt %)—Cu(0.5 wt %) alloy provides a wiring material effective for forming an Al damascene wiring within a wiring groove having a small wiring width and a high aspect ratio.

Figure 6:
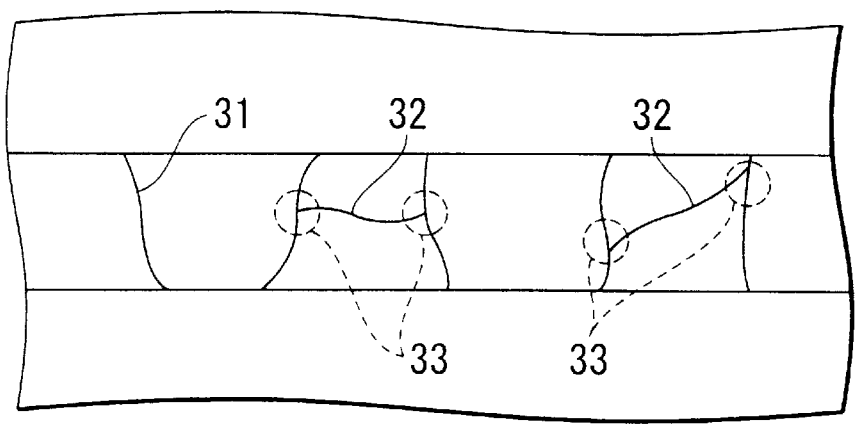
FIG. 6 shows the grain boundary crossing the wiring in the width direction of the wiring and the grain boundary crossing the wiring in the longitudinal direction of the wiring.

If the second Al wiring layer 9 is formed by the method employed in this embodiment, a grain boundary 32 crossing the wiring in the longitudinal direction may possibly be formed together with grain boundaries 31 crossing the wiring in the width direction of the wiring, as shown in FIG. 6. One of the causes of the formation of the grain boundary 32 is considered to reside in the discontinuity of the interface between the first Al film 7 and the second Al film. Where there is the grain boundary crossing the wiring in the longitudinal direction of the wiring, formed is a so-called "triple point" 33 in which three grain boundaries cross each other within the wiring. The presence of the triple point 33 causes deterioration in the resistance to EM.

Figure 7:
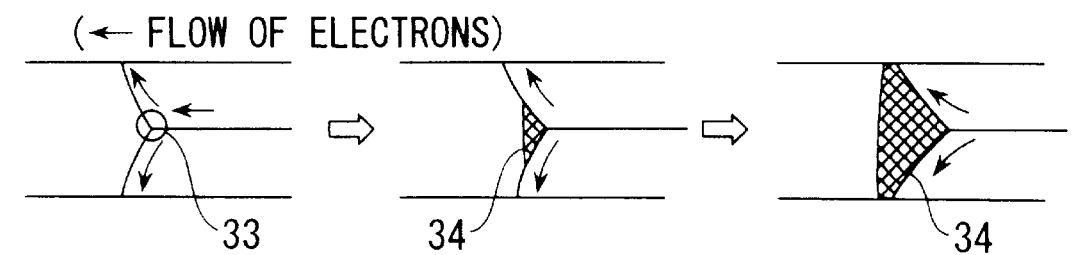
FIG. 7 shows a model of void generation caused by EM within a wiring having a triple point.

FIG. 7 shows a model of void generation caused by EM within a wiring having a triple point. Electromigration (EM) is the phenomenon that, if an electric current flows within the wiring, electrons collide against Al atoms so as to bring about migration of the Al atoms. The migration of the Al atom tends to take place along the grain boundary having a small diffusion coefficient. In the triple point, the Al atoms migrating along a grain boundary are branched into two directions, giving rise to depletion of atoms at the triple point. In other words, a void 34 is generated around the triple point. If the void 34 grows, the wiring is finally broken.

Figure 8:
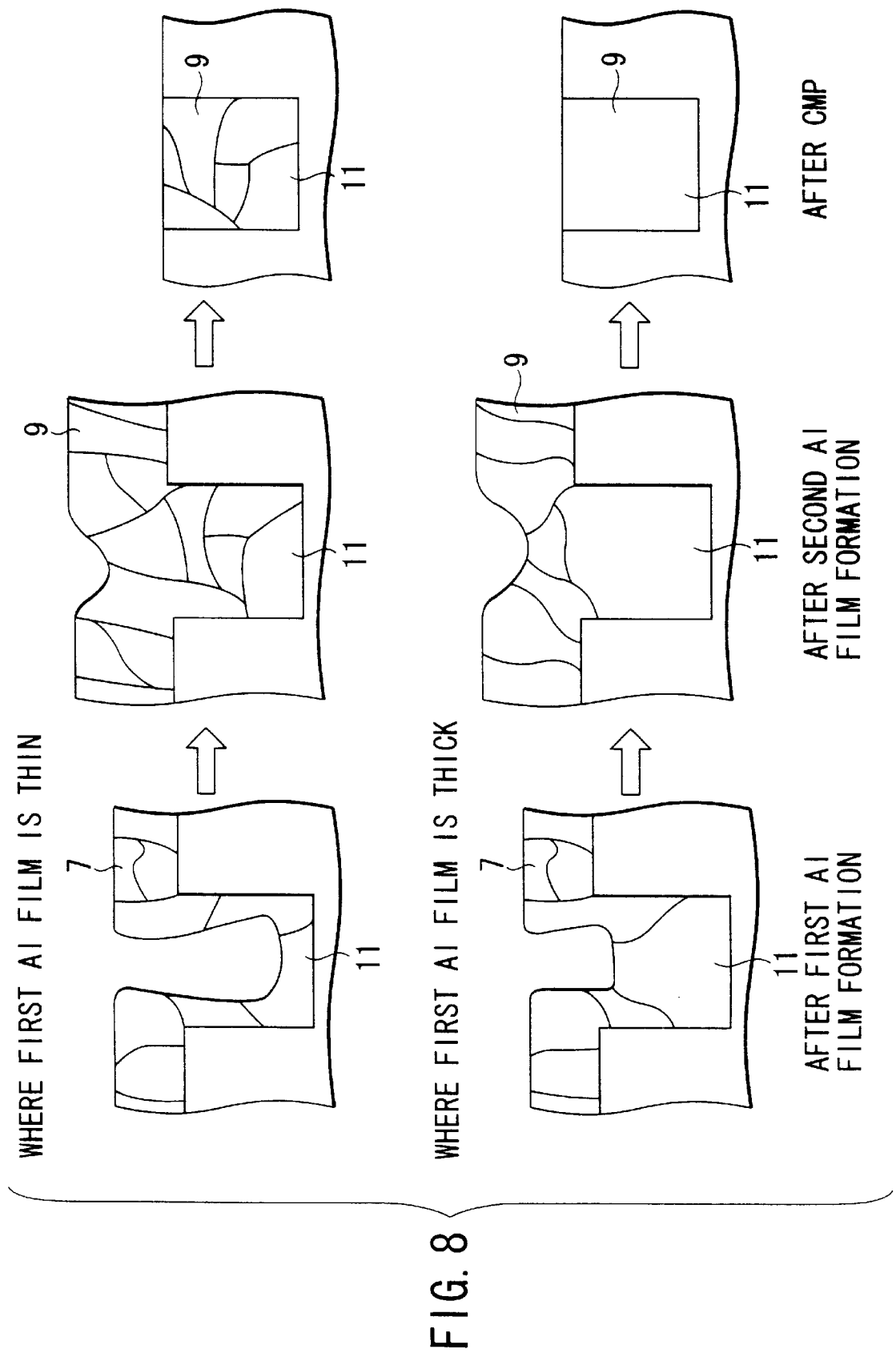
FIG. 8 shows the growing process of Al crystal grains within a wiring groove.

For avoiding the EM problem described above, it is effective to make the first Al film 7 thicker in this embodiment (first embodiment). FIG. 8 is a cross sectional view showing the growing process of the Al crystal grain within the wiring groove. Where the first Al film 7 is thin, it is difficult for the largest grain 11 to occupy the inner space of the wiring groove even if the grain 11 grows in the process of forming the second Al film, as shown in the drawing.

However, if the first Al film 7 is made thicker, the inner space of the wiring groove is filled substantially completely with the first Al film 7 in the case where the wiring groove has a low aspect ratio (wiring width/wiring depth). It follows that, where the first Al film 7 is formed thick, the large grain 11 grows to occupy the inner space of the wiring groove substantially completely after formation of the second Al film, making it possible to eliminate a discontinuous interface between the first Al film and the second Al film within the wiring groove, as shown in FIG. 8.

In this case, the grain boundary caused by the discontinuity of the interface is positioned outside the wiring groove, making it possible to remove the undesired grain boundary in the subsequent CMP process. As a result, the grain boundary structure between the first and second Al films 9 within the wiring groove can be made to have a bamboo structure.

Figure 9:
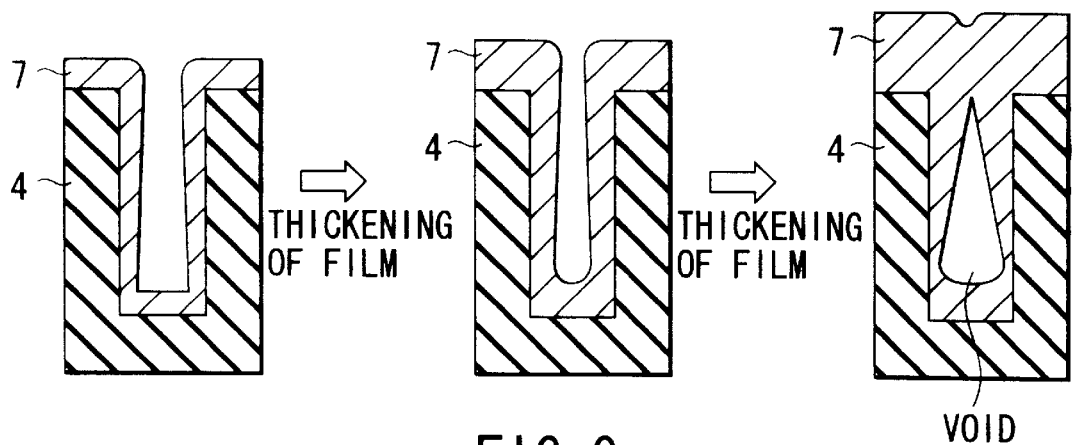
FIG. 9 shows how the opening of a hole is closed by a first Al film in the case where the first Al film is formed thick.

In this embodiment, the first Al film 7 is formed by LTS. LTS is a sputtering method that permits improving the directivity. However, it is impossible to eliminate completely the sputtered particles incident obliquely on the substrate surface. Therefore, it is unavoidable for the first Al film 7 to overhang the opening portion of the concave portion 5. If the first Al film 7 is formed thicker in an attempt to avoid the overhanging structure, the upper portion in the opening of the wiring groove is closed during the process of forming the first Al film 7, as shown in FIG. 9. Particularly, where the wiring groove has a high aspect ratio, the upper portion of the wiring groove is closed by the first Al film 7 with the inner space of the wiring groove partially left vacant. In this case, it is impossible to increase the thickness of the Al film within the wiring groove even if formation of the first Al film 7 is continued.

It should be noted that, even where the first Al film is thickened not to close the opening of the concave portion, the thickening of the first Al film produces the effect of decreasing the grain boundaries 32 crossing the wiring layer in the longitudinal direction of the wiring layer, because, if the loading amount of Al within the wiring groove is increased before the heating step, the grains of Al within the wiring groove grow preferentially within the wiring groove.

It should also be noted that, if the first Al film is formed thicker, the open portion of the connection hole is closed by the first Al wiring as in the case of the wiring groove. In this case, the first Al wiring within the connection hole cannot be made thicker.

For filling the connection hole 5a with Al, it is necessary to suppress agglomeration of the first Al film 7 within the connection hole 5a, and it is desirable to form the first Al film 7 as thick as possible within the connection hole 5a. However, where oxygen is introduced after formation of the thick first Al film 7, a problem takes place in the case where the upper opening of the connection hole is closed by the first Al film 7 as shown in FIG. 9. To be more specific, it is impossible to allow oxygen 8 to be adsorbed on the surface of the first Al film 7 within the connection hole unlike the process shown in FIG. 1D.

Where oxygen is introduced after formation of the first Al film 7, the first Al film 7 is formed as thick as possible, though the opening of the connection hole 5a should not be closed by the first Al film 7. To meet this requirement, it is necessary to control the directivity of the sputtered particles by controlling the Ar pressure, electric power, etc. so as to control the thickness of the first Al film 7.

In addition to the problem relating to the grain boundaries 32 crossing the wiring layer in the longitudinal direction of the wiring layer, it is necessary to take into account the possibility of an increase in the wiring resistance caused by oxidation of the surface of the first Al film 7 in the case of introducing oxygen after formation of the first Al film 7. Therefore, in order to fill the connection hole 5a with Al while ensuring an improved resistance to EM and a low wiring resistance, it is desirable to introduce oxygen in the smallest amount required for the filling of at least the connection hole 5a with Al after formation of the first Al film 7.

In this embodiment (first embodiment), oxygen is introduced into the first Al sputtering chamber immediately after formation of the first Al film 7. Alternatively, it is possible to introduce oxygen into the first Al sputtering chamber during formation of the first Al film 7. It should be noted, however, that, if the oxygen introduction into the first Al sputtering chamber is started in the initial stage of forming the first Al film 7, the surface of the Nb liner film 6 tends to be oxidized. If the surface of the Nb liner film 6 is oxidized, the reactivity between Al and Nb is lowered. Since the effect of suppressing the Al agglomeration is retained only during the reaction process with Nb, the capability of suppressing the Al agglomeration is also lowered, if the reactivity between Nb and Al is lowered. It follows that it is desirable not to introduce oxygen before formation of the first Al film 7 in order to prevent the Nb liner film 6 from being oxidized.

For suppressing agglomeration of the first Al film 7, it suffices for oxygen 8 to be present only partly on the first Al film 7. Therefore, in the case where oxygen is introduced during formation of the first Al film 7, followed by stopping the oxygen introduction and subsequently continuing the formation of the first Al film 7, oxygen 8 is not adsorbed on the surface of the first Al film 7 after formation of the first Al film 7.

Where the first Al film 7 containing oxygen 8 is formed by the method described above, it is possible to suppress the discontinuity of the interface between the first Al film 7 and the second Al film, which is caused by the oxidation of the surface of the first Al film 7. In addition, it is possible to maintain the wettability between the first Al film 7 and the second Al film. It follows that it is possible to improve the loading capability of the contact hole with Al and to suppress generation of the crystal boundaries. Incidentally, it is possible to allow the entire region of the first Al film 7 to contain oxygen.

Incidentally, where the oxygen introduction is stopped during formation of the first Al film 7 while continuing formation of the first Al film 7, the target surface is cleaned after formation of the first Al film 7. Therefore, where the Al reflow treatment is performed by using the cluster tool described previously in conjunction with the first embodiment, various processes can be performed in parallel during various process chambers.

For example, by transferring a second silicon substrate 1 from the Nb sputtering chamber into the first Al sputtering chamber immediately after transfer of a first silicon substrate 1 from the first Al sputtering chamber into the second Al sputtering chamber, the first Al film 7 can be formed on second silicon substrate during formation of the second Al film on the first silicon substrate.

In this step, if the surface of the Al target within the first Al sputtering chamber is kept clean, the Nb liner film 6 formed on the second silicon substrate 1 is not oxidized in the initial stage of forming the first Al film 7. Thus, the capability of suppressing the Al agglomeration performed by the Nb liner film 6 is not lowered.

In the first embodiment described above, oxygen is introduced into the first Al sputtering chamber in order to suppress agglomeration of the first Al film 7. Alternatively, another agglomeration suppressing agent, e.g., nitrogen, can be introduced into the first Al sputtering chamber for suppressing agglomeration of the first Al film 7. In this case, nitrogen is adsorbed on the surface of the first Al film 7 so as to nitride the surface of the first Al film 7 and, thus, to suppress the surface diffusion of Al, thereby to suppress agglomeration of the first Al film 7. However, since the nitriding proceeds slowly compared with the oxidation of Al, it is necessary to introduce a large amount of nitrogen gas into the first Al sputtering chamber over a long period of time, leading to a low through-put, compared with introduction of an oxygen gas. It follows that an oxygen gas is more desirable than a nitrogen gas when used for suppressing agglomeration of the first Al film 7.

It is also possible to permit oxygen to be adsorbed on the surface of the first Al film 7 by controlling appropriately the sputtering time for forming the first Al film 7 and the second Al film. In this case, the amount of adsorption of oxygen on the surface is determined by the degree of vacuum after each of the sputtering steps within the chamber housing the silicon substrate 1. It follows that it is necessary to control the degree of vacuum within the chamber in which the silicon substrate 1 is dependent on the sputtering time.

In the first embodiment described above, the technical idea of the present invention is applied to a DD (dual damascene) wiring. However, the technical idea of the present invention can also be applied to an Al-RIE wiring obtained by filling the concave portion with an Al film, followed by processing the that portion of the Al film which is positioned outside the concave portion by a photolithography process and a RIE process.

In the case of the Al-RIE wiring, the wiring groove and the connection hole need not be loaded simultaneously unlike the case of the DD wiring. Specifically, it suffices to fill the connection hole alone with Al in the case of the Al-RIE wiring. It follows that the aspect ratio of the concave portion that is filled with Al is small in the case of the Al-RIE wiring, compared with the DD wiring structure.

In the case of forming a wiring structure in which a first Al wiring positioned in a lower portion and a second Al wiring positioned in an upper position are connected to each other via a W plug, an interlayer insulating film is formed first on the first Al wiring layer, followed by forming a connection hole communicating with the first Al wiring in the interlayer insulating film. Further, the connection hole is filled with a W film by a W-CVD technology, followed by removing the excess W film by CMP so as to form the W plug. Then, a laminate structure consisting of a barrier metal layer, an aluminum layer and an anti-reflection film is formed on the entire surface, followed by forming an Al wiring overlapping with the W plug electrode by employing lithography and RIE.

On the other hand, where a plug electrode and a second wiring are formed by an Al reflow method as in the first embodiment of the present invention, the first Al wiring, the interlayer insulating film and the connection hole are formed, followed by filling the connection with Al. Further, an Al wiring overlapping with the connection hole is formed by employing lithography and RIE. In this case, the film-forming step for forming the Al plug and the Al wiring can be performed by a single Al reflow process. It follows that the number of manufacturing steps can be decreased, compared with the wiring structure using the W plug described above. As a result, it is possible to decrease the manufacturing cost.

Where the DD wiring is formed by filling the concave portion 5 with the first and second Al film 9 by the Al reflow method after formation of the Nb liner film 6 as in the first embodiment described above, the Nb liner film 6 and the first and second Al film 9 are formed on the two side walls and the single bottom surface of the connection hole 5a. Therefore, after formation of the first and second Al film 9, the AlNb alloy film 10 resulting from reaction between Al and Nb are formed on the two side walls and the single bottom surface of the connection hole 5a.

It should be noted that the Nb liner film 6 and the AlNb alloy film 10 act as compensation conductive films so as to produce the effect of improving the resistance to EM. It follows that the damascene wiring is advantageous in resistance to EM over the Al-RIE wiring in which the Nb liner film is formed in only the bottom portion of the connection hole. It should be noted, however, that the Al-RIE wiring is advantageous in some respects. Specifically, since the AlNb alloy film is not formed at the interface between the side wall of the Al wiring and the interlayer insulating film, the wiring resistance can be lowered.

Also, in a fine wiring groove having a high aspect ratio, the ratio of the sum of the surface areas of the two side surfaces to the entire surface area within the wiring groove is increased, with the result that the orienting properties of Al from the side surfaces of the wiring groove are rendered predominant. As a result, the Al (111) orienting properties in a direction perpendicular to the silicon substrate are lowered in a fine DD wiring.

On the other hand, when it comes to the Al-RIE wiring, the wiring is formed after processing of the Al film formed on a flattened interlayer insulating film, with the result that crystal grains of the Al film are formed from only a single bottom surface of the wiring. It follows that, in the case of forming a fine Al wiring, the Al-RIE wiring permits improving the orienting properties.

The Al-RIE wiring having high (111) orienting properties are excellent in its resistance to EM.

This is because crystal grains having a large diffusion coefficient are decreased in the Al film having (111) orienting properties. It should also be noted that, if the sputtering power of Nb is increased, Nb is oriented in (110) direction and Al after formation of the second Al film is oriented in (111) direction.

However, it has been found through the research conducted by the present inventors that the orienting properties of the first Al film 7 formed in a flat portion of the second interlayer insulating film 4 positioned outside concave portion 5 can be left substantially unchanged by controlling the amount of oxygen introduced into the first Al sputtering chamber after formation of the first Al film 7 at the minimum amount required for filling at least the concave portion 5 with Al. Therefore, even in the case of introducing oxygen, the first Al film 7 having high orienting properties can be formed by increasing the sputtering power in forming the Nb liner film 6. As a result, unstable Al grains are decreased, making it possible to obtain a damascene wiring or a RIE wiring having an improved resistance to EM.

It has been confirmed through the research conducted by the present inventors that the resistance to EM of each of the Al-RIE wiring and the damascene wiring is on the level that does not produce a practical problem.

In the first embodiment, the Al reflow is performed in two steps. It should be noted in this connection that oxygen is also adsorbed on the surface of a Cu film, as on the surface of the Al film, so as to prevent the surface diffusion of Cu and, thus, to suppress agglomeration of the Cu film. It follows that the two step reflow method, in which a Cu film is formed in place of the first Al film 7, followed by introducing oxygen into the chamber and subsequently forming the second Al film by a sputtering method while heating chamber, also produces the effects similar to those obtained by the two step reflow of Al. For example, the loading characteristics of the Al film can be improved. Further, it is possible to use oxygen together with another element as the agglomeration suppressing material.

Further, in the first embodiment of the present invention, the first Al film 7 is formed by a sputtering method. However, it is also possible to form the first Al film 7 by, for example, an LPCVD method.

(Second Embodiment)

FIGS. 10A to 10D are cross sectional views collectively showing a method of manufacturing a semiconductor device according to a second embodiment of the present invention. Incidentally, those portions of FIGS. 10A to 10D which correspond to FIGS. 1A to 1F are denoted by the same reference numerals so as to avoid an overlapping description.

In the first embodiment, oxygen 8 is introduced after formation of the first Al film 7 to permit the introduced oxygen 8 to be adsorbed on the surface of the first Al film 7, thereby to suppress the Al agglomeration. In the second embodiment, however, Nb atoms are adsorbed as an agglomeration suppressing material on the surface of the first Al film 7, thereby to suppress agglomeration of Al.

In the first step, the first interlayer insulating film 2, the first wiring layer 3, the second interlayer insulating film 4, the connection hole 5, the Nb liner film 6, and the first Al film 7 are formed on the silicon substrate 1 having an element (not shown) formed thereon. The Nb liner film 6 has a thickness of 15 nm, and the first Al film 7 has a thickness of 400 nm. Each of these films is formed by LTS as in the first embodiment.

In the next step, Nb 12 is adsorbed as an agglomeration suppressing material for suppressing agglomeration of the first Al film 7 on the surface of the first Al film 7 by a sputtering method, as shown in FIG. 12B. The Nb film thus formed is not a continuous film but is a discontinuous film formed apart from each other. Therefore, the surface of the first Al film 7 is partially exposed to the outside.

Figure 10A:
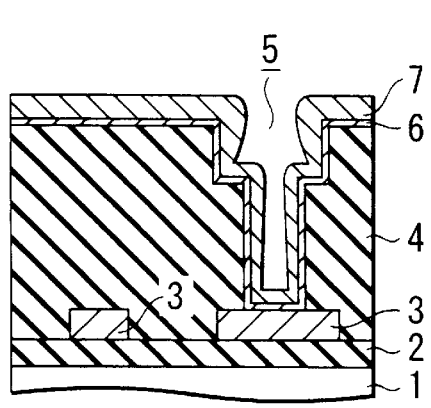
FIGS. 10A to 10D are cross sectional views collectively showing a method of manufacturing a semiconductor device according to a second embodiment of the present invention.
Figure 10B:
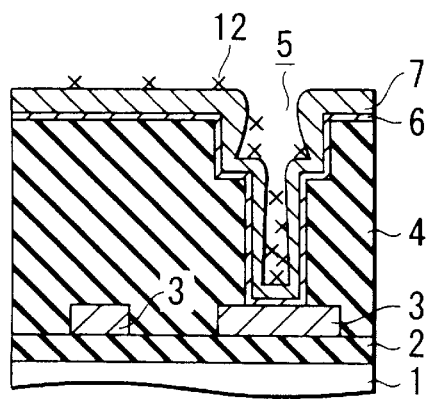
Figure 10C:
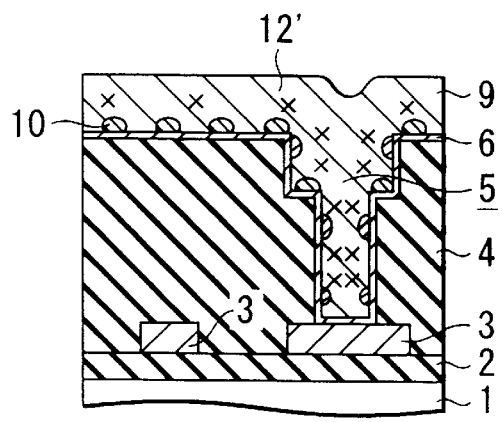
Figure 10D:
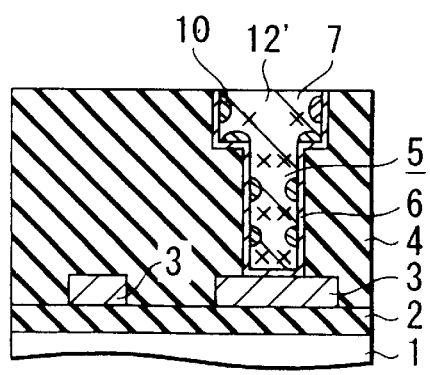

Then, the second Al film is formed while heating the silicon substrate 1 so as to fill the connection hole 5 with the first and second Al film 9 including a Nb film or an NbAl alloy film 12', as shown in FIG. 10C. In this step, the AlNb alloy film 10 is formed at the interface between the Nb liner film 6 and the first and second Al film 9.

Finally, the excess portions of the first and second Al film 9, the AlNb alloy film 10, and the Nb liner film 9, which are positioned outside the connection hole 5, are removed by CMP so as to finish forming the second wiring layer 9.

As already described in conjunction with the first embodiment, the first Al film 7 covering the inner surface of the connection hole 5 provides the diffusion route of Al in the step of forming the second wiring layer 9 by the Al reflow method. In the subsequent sputtering step under heating of the second Al film, Al is fluidized along the diffusion route so as to fill the inner space of the connection hole 5. Therefore, if the first Al film 7 is agglomerated during the sputtering process performed under heating, the diffusion route is closed, resulting in failure for the inner space of the connection hole 5 to be filled with Al.

As already described in conjunction with the first embodiment, the Al agglomeration is brought about by the surface diffusion and grain boundary diffusion of the Al atoms accompanying the heating of the substrate. Therefore, the Al agglomeration can be suppressed by suppressing the surface diffusion of the Al atoms. It follows that, if Nb particles are adsorbed on the surface of the first Al film 7 as in this second embodiment, the Nb particles coupled with the Al atoms serve to suppress the surface diffusion of the Al atoms so as to suppress agglomeration of the first Al film 7, as in the first embodiment in which the oxygen atoms coupled with the Al atoms serve to suppress the surface diffusion of the Al atoms.

In the process of Al reflow, the second Al film is fluidized along the first Al film 7 into the connection hole 5. At the same time, the first Al film 7 itself is deformed so as to contribute to the fluidization.

However, where a thick Nb film 12 is formed on the first Al film 7, the first Al film 7 is unlikely to be deformed, as in the case where a thick oxide film is formed in the first embodiment, with the result that the first Al film 7 fails to be fluidized sufficiently so as to bring about an insufficient filling of the connection hole 5 with Al. Under the circumstances, it is desirable to form on the first Al film 7 a Nb film acting as an agglomeration suppressing film in a manner to form a discontinuous film on at least the inner surface of the connection hole 5. To form such a discontinuous Nb film, it is necessary to decrease the amount of Nb used. According to the research conducted by the present inventors, it is desirable use Nb in an amount sufficient for forming a Nb film having a thickness of about 5 nm.

Agglomeration of the first Al film 7 takes place in the thinnest portion of the film. To be more specific, agglomeration of the first Al film 7 is most likely to take place in the side wall on the bottom portion of the connection hole 5. It should also be noted that LTS certainly permits improving the directivity of the sputtered particles. However, the sputtered particles include oblique components, making it unavoidable for the first Al film 7 to overhang the upper open portion of the connection hole 5. In other words, the opening of the connection hole 5 is narrowed, making it difficult for the sputtered particles to run to reach the side wall of the bottom portion of the connection hole 5. As a result, it is difficult to form the first Al film 7 as a continuous film in the side wall on the bottom portion of the connection hole 5 so as to bring about agglomeration of Al.

On the other hand, when it comes to the Nb film 12 acting as an agglomeration suppressing film, no problem is generated even if the Nb film is formed by a sputtering method for making the Nb film discontinuous as described above. It is also possible to employ a CVD method that is satisfactory in the step coverage characteristics for permitting Nb particles to be adsorbed on the side wall on the bottom portion of the connection hole. Particularly, in the initial stage of the film formation by the CVD method, the CVD film grows in general in the shape of an island from the initial nucleus, making it possible to form the Nb film 12 such that the surface of the first Al film 7 is partially exposed to the outside.

It has been confirmed that, where the Nb film 12 is formed on the first Al film 7 as in this second embodiment, it is possible to fill the connection hole 5 having a high aspect ratio with Al, compared with the case where the Nb film 12 is not formed.

Also, in the DD structure of this second embodiment, the NbAl alloy film 12 within the second wiring layer 9 serves to suppress diffusion of the Al atoms so as to improve the resistance to EM and the resistance to SM.

In the second embodiment, Nb particles are adsorbed on the first Al film 7. However, it is also possible to form the Nb film 12 within the first Al film 7. To be more specific, it is possible to diffuse Nb into the first Al film 7 as shown in FIG. 11 in place of the process shown in FIG. 10B.

Agglomeration of the Al film is brought about by the surface diffusion and the grain boundary diffusion of Al. Where Nb particles are dispersed into the first Al film 7 as shown in FIG. 11, the Al agglomeration can be suppressed by suppressing mainly the grain boundary diffusion of the Al atoms. Further, since Nb particles need not be adsorbed on the surface of the first Al film in this case, the surface of the first Al film 7 can be kept clean. As a result, the flowability of the first Al film itself and the wettability between the first Al film 7 and the second Al film are not impaired so as to further improve the loading characteristics.

Figure 11:
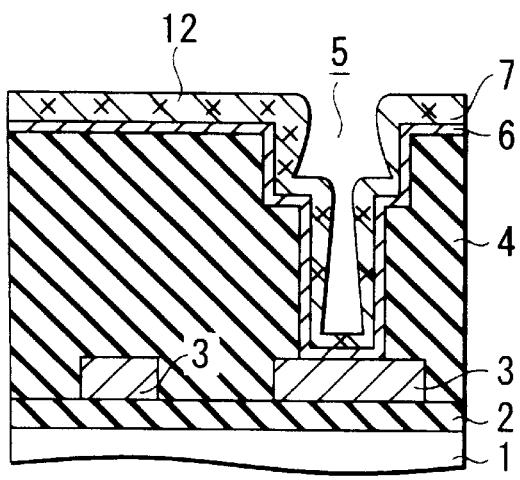
FIG. 11 is a cross sectional view showing a modification of the second embodiment.
Figure 12:
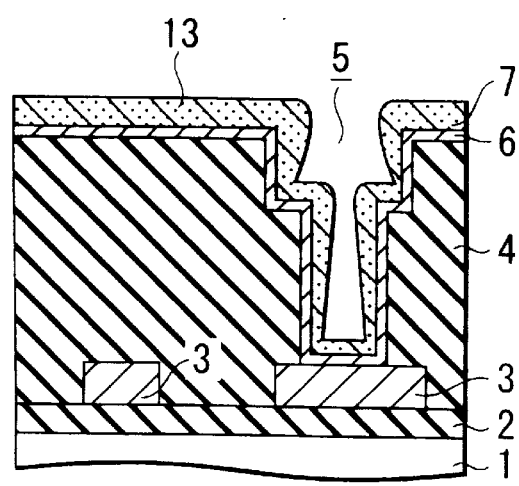
FIG. 12 is a cross sectional view showing another modification of the second embodiment.

It is also possible to disperse Nb acting as an agglomeration suppressing material on the atomic level into the first Al film 7, as shown in FIG. 12. In this case, Nb 13 is present at the grain boundary and on the surface of the Al crystal grains, with the result that it is possible to suppress the surface diffusion and the grain boundary diffusion of the Al atoms. It follows that the Al agglomeration can be suppressed more effectively. Further, since Nb 13 is present in this case within the first Al film 7, the first Al film 7 is deformed easily. In addition, the wettability between the first Al film 7 and the second Al film is not impaired. It follows that it is possible to further improve the loading characteristics.

Where Nb is adsorbed by the sputtering method on the first Al film 7 or is dispersed within the first Al film 7 as shown in FIG. 10 or 11, it is necessary to use a sputtering chamber for forming the first Al film 7 and another sputtering chamber for adsorbing Nb. However, in the case of forming the first Al film 7 having Nb 13 dispersed therein as shown in FIG. 12, it suffices to use a single sputtering chamber, provided that a Nb-added Al target is used, and, thus, the first Al film 7 having Nb 13 dispersed therein can be formed by a single sputtering step, leading to an improved through-put. It is also possible to save the cost of the manufacturing apparatus.

A CVD method can also be employed for forming the first Al film 7 having Nb 13 dispersed therein. In this case, a mixed gas consisting of the raw material gas of Al and the raw material gas of Nb can be used as the raw material gas. Alternatively, the first Al film can be formed under the CVD condition that an impurity such as carbon acting as an agglomeration suppressing material, which is contained in the raw material gas used for forming an Al film, is retained within the formed Al film. The first Al film having Nb 13 dispersed therein can also be formed by forming first the first Al film 7, followed by implanting Nb ions into the first Al film 7.

In the second embodiment, Nb is used as an agglomeration suppressing material. However, the agglomeration suppressing material is not limited to Nb. To be more specific, in order to suppress agglomeration of the Al film, it suffices to suppress diffusion of the Al atoms on the surface, the grain boundary and the interface and, thus, it is possible to use, for example, Ta, Ti, W, or C that is capable of suppressing the diffusion of the Al atoms.

What should also be noted is that a synergetic effect can be obtained if the method of introducing oxygen after formation of the first Al film explained in conjunction with the first embodiment and the method of the second embodiment are used in combination so as to further improve the capability of filling the concave portion with Al.

(Third Embodiment)

FIGS. 13A to 13D are cross sectional views collectively showing a method of manufacturing a semiconductor device according to a third embodiment of the present invention. Incidentally, those portions of FIGS. 13A to 13D which correspond to FIGS. 1A to 1F are denoted by the same reference numerals so as to avoid an overlapping description.

In the first step, the first interlayer insulating film 2, the first wiring layer 3, the second interlayer insulating film 4, the connection hole 5, and the Nb liner film 6 are formed on the silicon substrate 1 having an element (not shown) formed thereon. The Nb liner film 6 has a thickness of 15 nm and is formed by LTS as in the first embodiment.

Figure 13A:
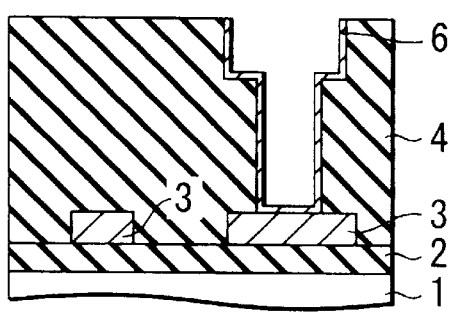
FIGS. 13A to 13D are cross sectional views collectively showing a method of manufacturing a semiconductor device according to a third embodiment of the present invention.
Figure 13C:
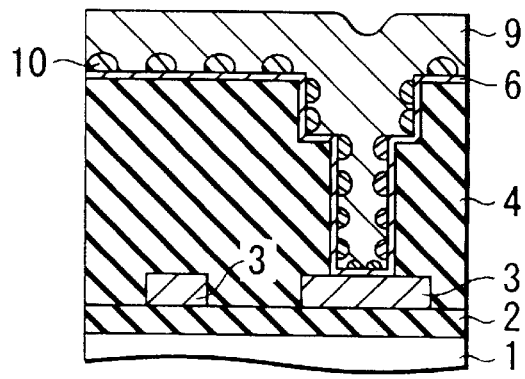
Figure 13B:
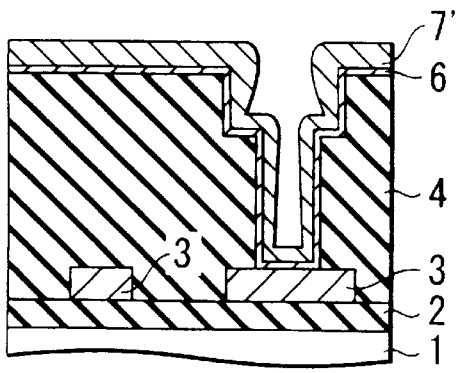

Then, the first Al film (pure Al film) 7' that does not contain an impurity is formed by LTS in a thickness of 400 nm in a manner to cover the inner surface of the connection hole 5, as shown in FIG. 13B. After formation of the first Al film 7', the second Al film is formed while heating the silicon substrate 1 so as to fill the inner space of the connection hole 5 with first and second Al film 9, as shown in FIG. 13C. In this third embodiment, an Al alloy containing 1% by weight of Cu is used as the second Al film. Therefore, the first and second Al film 9 is a mixed film consisting of a pure Al film and an Al alloy film. Also, an AlNb alloy film 10 is formed at the interface between the Nb liner film 6 and the first Al film 7'.

Figure 13D:
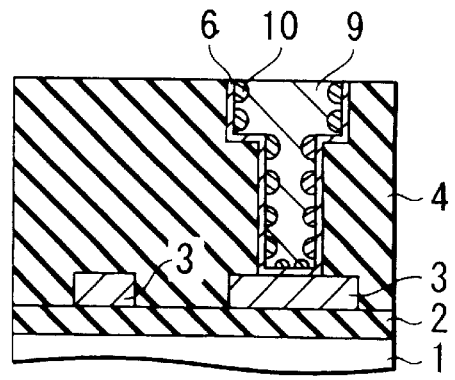

Finally, the excess portions of the first and second Al film 9, the AlNb alloy film 10 and the Nb liner film 6 which are positioned outside the connection hole 5 are removed by CMP, as shown in FIG. 13D so as to finish forming the second wiring 9.

In this third embodiment, a pure Al film that does not contain an impurity is used as the first Al film. The agglomerating behavior of a thin film is deeply related to the melting point of the material. The temperature at which agglomeration takes place is lowered with decrease in the melting point of the material. It should be noted in this connection that the melting point of the Al alloy film containing an impurity such as Cu is lower than that of a pure Al film. Therefore, in order to suppress agglomeration of the first Al film 7, it is desirable to use a pure Al film that does not contain an additive in place of an Al alloy film containing an impurity such as Cu.

On the other hand, an Al film containing an impurity such as Cu has a low melting point and, thus, the flowability of the Al film is increased. Thus, it is desirable to use an Al film containing an additive effective for lowering the melting point, i.e., for improving the flowability, such as Cu for forming the second Al film that is formed by a sputtering method performed under heating while fluidizing the Al film.

Further, Cu contained in the Al film is precipitated at the Al crystal grain boundary in the temperature dropping process after the reflow process. It should be noted that the migration of the Al atoms by EM tends to take place at the crystal grain boundary or on the surface having a small diffusion coefficient. Therefore, the resistance to EM can be improved, if Cu is added to the Al film.

As described above, in the case of using a pure Al film as the first Al film and an Al alloy film containing Cu as the second Al film as in the third embodiment of the present invention, it is possible to suppress agglomeration of Al even if an agglomeration suppressing material is not used. It should also be noted that Cu is diffused into the first Al film during the sputtering process performed under heating, with the result that Cu is finally added to the entire first and second Al film 9. As a result, the connection hole 5 can be filled with Al and the resistance to EM can be ensured.

The addition amount of Cu to Al can be controlled freely depending on the ratio in thickness of the first Al film 7 to the second Al film by adding a desired amount of Cu to the sputter target in the step of forming the second Al film.

What should also be noted is that a synergetic effect can be obtained if the method of introducing oxygen after formation of the first Al film explained in conjunction with the first embodiment and the method of the third embodiment are used in combination so as to further improve the capability of filling the concave portion with Al.

The present invention is not limited to the embodiments described above. For example, a Nb film is used as the liner film in each of the embodiments described above. However, it is also possible to use as the liner film various other films including, for example, a NbN film, a TiN film, a Ti film, a Nb/NbN film consisting of a Nb film and a NbN film formed on the Nb film, and a Ti/TiN film consisting of a Ti film and a TiN film formed on the Ti film.

Also, the technical idea of the present invention can be applied to a contact plug in addition to the damascene wiring. Further, various other modifications are available within the technical scope of the present invention.

As described above in detail, agglomeration of the first and second conductive films can be effectively suppressed in the present invention by subjecting the first and second conductive films to a reflow process under the condition that an agglomeration suppressing material is contained in the first conductive film. As a result, it is possible to provide a semiconductor device having a wiring structure in which the inner space of a concave portion having a high aspect ratio is filled with the wiring layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:

forming an interlayer insulating film having a concave portion on a semiconductor substrate;

forming a liner film on an inner surface of said concave portion;

forming a first conductive film within the concave portion, said first conductive film containing an agglomeration suppressing material for suppressing agglomeration of said first conductive film; and forming a second conductive film within the concave portion while heating said semiconductor substrate and permitting reflow of said first and second conductive films to fill the concave portion with these conductive films;

wherein said agglomeration suppressing material is selected from a group consisting of O, N, Nb, Ta, Ti, W, and C.

2. The method of manufacturing a semiconductor device according to claim 1, wherein said agglomeration suppressing material is adsorbed on the surface of said first conductive film after formation of said first conductive film.

3. The method of manufacturing a semiconductor device according to claim 1, wherein said agglomeration suppressing material is introduced into said first conductive film during formation of said first conductive film.

4. The method of manufacturing a semiconductor device according to claim 1, wherein said first conductive film is formed by shaping a conductive material containing said agglomeration suppressing material into a film.

5. The method of manufacturing a semiconductor device according to claim 1, wherein said liner film is a single layer structure or a laminate structure and made of a material selected from the group consisting of Nb, Ti, NbN and TiN.

6. The method of manufacturing a semiconductor device according to claim 1, wherein said conductive film is formed of a metal selected from the group consisting of Al, Cu, an Al alloy and a Cu alloy.

7. The method of manufacturing a semiconductor device according to claim 1, wherein said concave portion is selected from the group consisting of a wiring groove, a connection hole and a combination of a connection hole and a wiring groove communicating with said connection hole.

8. A method of manufacturing a semiconductor device, comprising the steps of:

forming an interlayer insulating film having a concave portion on a semiconductor substrate;

forming a liner film on the inner surface of said concave portion;

forming a first conductive film that does not contain impurities within the concave portion; and forming a second conductive film containing an impurity within said concave portion while heating the semiconductor substrate and permitting reflow of said first and second conductive films to fill the concave portion with the conductive films.

9. The method of manufacturing a semiconductor device according to claim 8, wherein said first and second conductive films is made of Al and said impurity is Cu.

10. The method of manufacturing a semiconductor device according to claim 8, wherein said liner film is a single layer structure or laminate structure and made of a material selected from the group consisting of Nb, Ti, NbN and TiN.

11. The method of manufacturing a semiconductor device according to claim 8, wherein said concave portion is selected from the group consisting of a wiring groove, a connection hole and a combination of a connection hole and a wiring groove communicating with said connection hole.

* * * * *

UNITED STATES PATENT AND TRADEMARK OFFICE
CERTIFICATE OF CORRECTION

PATENT NO. : 6,436,813 B1
DATED : August 20, 2002
INVENTOR(S) : Oikawa et al.

It is certified that error appears in the above-identified patent and that said Letters Patent is hereby corrected as shown below:

Column 22,
Line 21, change "is made" to -- are made --.

Signed and Sealed this

Eighth Day of April, 2003

JAMES E. ROGAN
*Director of the United States Patent and Trademark Office*